United States Patent
Negoro

(10) Patent No.: US 7,646,242 B2
(45) Date of Patent: Jan. 12, 2010

(54) OPERATIONAL AMPLIFIER CIRCUIT, CONSTANT VOLTAGE CIRCUIT USING THE SAME, AND APPARATUS USING THE CONSTANT VOLTAGE CIRCUIT

(75) Inventor: Takaaki Negoro, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 17 days.

(21) Appl. No.: 12/144,852

(22) Filed: Jun. 24, 2008

(65) Prior Publication Data

US 2009/0033420 A1 Feb. 5, 2009

(30) Foreign Application Priority Data

Jul. 31, 2007 (JP) .............................. 2007-199086

(51) Int. Cl.
*H03F 3/45* (2006.01)
(52) U.S. Cl. ........................ 330/253; 330/310; 330/260
(58) Field of Classification Search ................. 330/253, 330/310, 260
See application file for complete search history.

(56) References Cited

U.S. PATENT DOCUMENTS

| | | | | |
|---|---|---|---|---|
| 5,363,063 A | * | 11/1994 | Laot et al. ..................... | 330/298 |
| 5,708,392 A | * | 1/1998 | Gross .......................... | 330/308 |
| 7,253,687 B2 | * | 8/2007 | Deval et al. ................... | 330/298 |
| 7,432,762 B2 | * | 10/2008 | Bhattacharya et al. ...... | 330/253 |
| 7,525,389 B2 | * | 4/2009 | Nishikawa et al. .......... | 330/298 |
| 2006/0138546 A1 | | 6/2006 | Negoro et al. | |
| 2006/0152284 A1 | | 7/2006 | Morino | |
| 2007/0188216 A1 | | 8/2007 | Negoro | |

FOREIGN PATENT DOCUMENTS

| | | |
|---|---|---|
| JP | 2005-025596 | 1/2005 |
| JP | 2005-063231 | 3/2005 |
| JP | 3683185 | 6/2005 |
| JP | 2005-202781 | 7/2005 |

* cited by examiner

*Primary Examiner*—Patricia Nguyen
(74) *Attorney, Agent, or Firm*—Dickstein Shapiro LLP

(57) ABSTRACT

A disclosed operational amplifier circuit with a multi-stage amplifier configuration provides fast-response and high withstand-voltage characteristics without using high withstand-voltage transistors as output transistors in its amplifying stages. The output voltage range of a differential amplifier circuit in a first stage is limited by voltage clamping based on a reverse withstand voltage of a bipolar diode. The output voltage range of an amplifier circuit in a second stage is limited by voltage clamping based on a reverse withstand voltage of another bipolar diode. A constant voltage circuit and an apparatus including such an operational amplifier circuit are also disclosed.

15 Claims, 3 Drawing Sheets

US 7,646,242 B2

OPERATIONAL AMPLIFIER CIRCUIT, CONSTANT VOLTAGE CIRCUIT USING THE SAME, AND APPARATUS USING THE CONSTANT VOLTAGE CIRCUIT

BACKGROUND OF THE INVENTION

1. Field of the Invention

The present invention relates to an operational amplifier circuit having fast-response characteristics and a high-frequency operational range. The invention also relates to a constant voltage circuit that employs such an operational amplifier circuit, and an apparatus that employs such a constant voltage circuit.

2. Description of the Related Art

Conventionally, in operational amplifier circuits and constant voltage circuits employing an operational amplifier circuit, metal-oxide semiconductor (MOS) transistors are used that are advantageous in reducing current consumption. In order to increase the withstand voltage of a MOS transistor, generally the gate oxide film is made thicker to prevent gate oxide film breakdown, or the channel length L is increased to prevent punch-through. Such MOS transistors, however, have limited current drive capacity and are not suitable for handling large currents. On the other hand, bipolar transistors are capable of handling large currents by controlling their base current even when their withstand voltages are increased. Generally, bipolar transistors are mainly used in constant voltage circuits partly because they are capable of driving large currents at a high withstand-voltage and ensuring a high ripple removal ratio in a high-frequency band. However, MOS transistors need to be used in order to reduce current consumption.

FIG. 1 shows an example of a conventional constant voltage circuit composed of MOS transistors.

In this circuit, in order to enable a high speed operation, an operational amplifier circuit 101 that controls the operation of a driver transistor M101 has a multi-stage amplifier configuration consisting of a differential amplifier circuit AMPa, which is a differential amplifying stage, and an amplifier circuit AMPb, which is an output stage. In this configuration, the gate voltage of the driver transistor M101 is controlled by the amplifier circuit AMPb in response to a shift in an output voltage Vout. Thus, to the gate of the driver transistor M101 is applied a voltage ranging from a ground voltage GND to an input voltage Vdd. Similarly, the output voltage of the differential amplifier circuit AMPa ranges from the ground voltage GND to the input voltage Vdd. As a result, PMOS transistors M112 and M115 need to have high withstand voltages.

Thus, constant voltage circuits that handle high voltages, such as 36 V, generally employ high withstand-voltage MOS transistors. Because high withstand-voltage MOS transistors have a thick gate oxide film and a large channel length L, these transistors have low current drive capacity, making them unsuitable for use in a constant voltage circuit that needs to output large currents and have a fast response.

The aforementioned problem has been dealt with by using laterally diffused MOS (LDMOS) transistors as a driver transistor in a constant voltage circuit (see Japanese Patent No. 3683185, for example). However, in order to realize a fast response, a high withstand-voltage transistor needs to be used to drive the gate of the LDMOS transistor.

If a high withstand-voltage transistor is used as the transistor M115 for driving the gate of the driver transistor M101 in the circuit of FIG. 1, increasing the constant current i102 in order to realize a fast response naturally makes it necessary to increase the size of the PMOS transistor M115. Furthermore, in order to stabilize circuit operation during a steady-state operation, the differential amplifier circuit AMPa and the amplifier circuit AMPb need to have the same operating point in order to align their outputs. This means that the PMOS transistors M111 and M112 need to have the same size as the PMOS transistor M115. As a result, the channel widths W of the PMOS transistors M111, M112, and M115 have to be increased, which results in an increase in drain junction capacity. This is disadvantageous in terms of fast response characteristics.

Because the PMOS transistors M111, M112, and M115 have relatively large channel length L, their output resistance is large. As a result, the pole of the operational amplifier circuit 101 tends to be positioned at the lower frequency side, thus making operation in a high-frequency range disadvantageous. In a steady-state operation, the driver transistor M101 has a sufficient current drive capacity for an output current iout outputted at an output terminal OUT, so that the gate-source voltage of the driver transistor M101 does not become too high.

Thus, in a constant voltage circuit in which an operational amplifier circuit of a multi-stage amplifier configuration is employed in order to achieve a fast response, if the circuit is composed of high withstand-voltage MOS transistors alone, the pole of the output of each amplifying stage of the operational amplifier circuit is positioned at the low-frequency side, making phase compensation difficult at small load. If the constant current supplied to each amplifying stage of the operational amplifier circuit is to be increased to achieve a fast response, the MOS transistors must have a large channel width W, whereby the overlap capacity between gate and drain and the drain junction capacity increase, which is disadvantageous for the realization of high-speed operation.

SUMMARY OF THE INVENTION

It is a general object of the present invention to overcome the aforementioned problems.

A more specific object of the invention is to provide an operational amplifier circuit whereby, without using high withstand-voltage transistors as output transistors in each amplifying stage of a multi-stage amplifier configuration, fast response and high withstand voltage characteristics can be achieved. Another object of the invention is to provide a constant voltage circuit that employs such an operational amplifier circuit, and an apparatus that employs such a constant voltage circuit.

In one aspect, the invention provides an operational amplifier circuit having a multi-stage configuration including plural amplifying stages. The operational amplifier circuit comprises a first amplifier circuit unit including a differential amplifier circuit configured to amplify a voltage difference between input voltages at two input terminals; a second amplifier circuit unit including at least one amplifier circuit connected in series with an output terminal of the first amplifier circuit unit in order to amplify an output voltage of the first amplifier circuit unit; and a voltage limiting circuit unit configured to limit the output voltage of the first amplifier circuit unit and an output voltage of each amplifier circuit of the second amplifier circuit unit so that the amplitude of each of the output voltages is equal to or smaller than a predetermined value.

In a preferred embodiment, the voltage limiting circuit unit includes a first clamping circuit and a second clamping circuit configured to limit the maximum value or the minimum value of the output voltage of the first amplifier circuit unit and the output voltage of each amplifier circuit of the second amplifier circuit unit, respectively.

In another preferred embodiment, each of the clamping circuits limits the maximum value or the minimum value of the corresponding output voltage by clamping based on a predetermined reverse withstand voltage of a bipolar diode.

In another preferred embodiment, the differential amplifier circuit of the first amplifier circuit unit and each amplifier circuit of the second amplifier circuit unit include a fine MOS transistor as an output transistor.

In another preferred embodiment, the differential amplifier circuit includes a differential pair consisting of a pair of transistors, a load circuit providing a load to the differential pair, and a first constant current source configured to supply a predetermined first constant current to the differential pair. The load circuit is formed by the aforementioned output transistors.

In yet another preferred embodiment, an output signal from the differential amplifier circuit of the first amplifier circuit unit is inputted to the output transistor of each amplifier circuit of the second amplifier circuit unit. Each amplifier circuit of the second amplifier circuit unit includes a second constant current source configured to supply a predetermined second constant current to the output transistor of the amplifier circuit.

In another aspect, the invention provides a constant voltage circuit for converting an input voltage at an input terminal into a constant voltage that is outputted via an output terminal. The constant voltage circuit comprises a driver transistor configured to cause a current to flow from the input terminal to the output terminal in accordance with a control signal; and a control circuit unit including an operational amplifier circuit with a multi-stage configuration including plural amplifying stages. The amplifying stages are configured to amplify a differential voltage between a proportional voltage proportional to a voltage at the output terminal and a predetermined reference voltage to obtain the control signal that is applied to a control electrode of the driver transistor in order to control the operation of the driver transistor. The operational amplifier circuit includes a first amplifier circuit unit including a differential amplifier circuit configured to amplify a voltage difference between input voltages at two input terminals; a second amplifier circuit unit including at least one amplifier circuit connected in series with an output terminal of the first amplifier circuit unit to amplify an output voltage of the first amplifier circuit unit; and a voltage limiting circuit unit configured to limit the output voltage of the first amplifier circuit unit and an output voltage of each amplifier circuit of the second amplifier circuit unit such that the amplitude of each of the output voltages does not exceed a predetermined value.

In a preferred embodiment, the voltage limiting circuit unit includes a first clamping circuit and a second clamping circuit each configured to limit the maximum value or the minimum value of the output voltage of the first amplifier circuit unit and the output voltage of each amplifier circuit of the second amplifier circuit unit, respectively.

In another preferred embodiment, each of the clamping circuits is configured to limit the maximum value or the minimum value of the corresponding output voltage by clamping based on a predetermined reverse withstand voltage of a bipolar diode.

In another preferred embodiment, each of the differential amplifier circuit of the first amplifier circuit unit and each amplifier circuit of the second amplifier circuit unit includes a fine MOS transistor as an output transistor.

In another preferred embodiment, the differential amplifier circuit includes a differential pair consisting of a pair of transistors, a load circuit providing a load to the differential pair, and a first constant current source configured to supply a predetermined first constant current to the differential pair. The load circuit is formed by the aforementioned output transistors.

In another preferred embodiment, an output signal from the differential amplifier circuit of the first amplifier circuit unit is inputted to the output transistor of each amplifier circuit of the second amplifier circuit unit. Each amplifier circuit of the second amplifier circuit unit includes a second constant current source configured to supply a predetermined second constant current to the output transistor of the amplifier circuit.

In yet another aspect, the invention provides an apparatus comprising the above constant voltage circuit. The apparatus performs a predetermined function using an output voltage of the constant voltage circuit as a power source.

The apparatus may be an automotive electronic apparatus or an image forming apparatus.

Thus, in accordance with various embodiments of the present invention, an output voltage of the first amplifier circuit unit and an output voltage of each amplifier circuit of the second amplifier circuit unit of an operational amplifier circuit are limited to have an amplitude equal to or smaller than a predetermined value. In this way, improved fast response and high withstand-voltage characteristics can be obtained without using high withstand-voltage transistors as output transistors in each amplifying stage of the multi-stage amplifier configuration. Furthermore, the pole of the operational amplifier circuit can be positioned on a high-frequency side. By using such an operational amplifier circuit in a constant voltage circuit, the circuit can respond to fluctuations in output voltage at high speed and produce large output currents. The ripple removal ratio of the constant voltage circuit regarding its output voltage in a high-frequency band can be improved, so that the range of the circuit can be extended to a higher-frequency band.

BRIEF DESCRIPTION OF THE DRAWINGS

These and other objects, features and advantages of the invention will be apparent to those skilled in the art from the following detailed description of the invention, when read in conjunction with the accompanying drawings, in which.

DETAILED DESCRIPTION OF THE PREFERRED EMBODIMENTS

In the following, the present invention is described by way of embodiments and with reference to the drawings.

Figure 1:
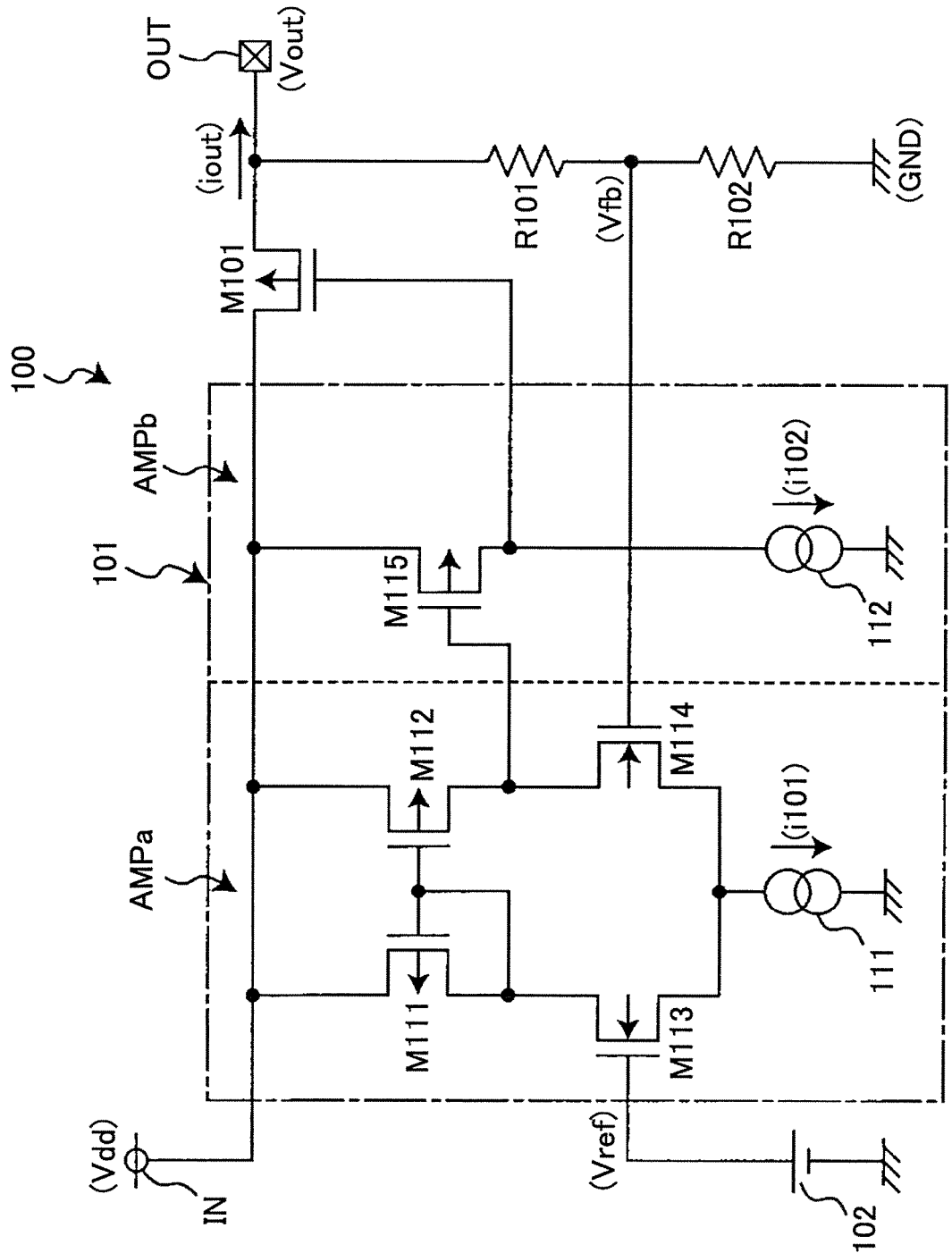
FIG. 1 shows a constant voltage circuit in which a conventional operational amplifier circuit employing MOS transistors is used.
Figure 2:
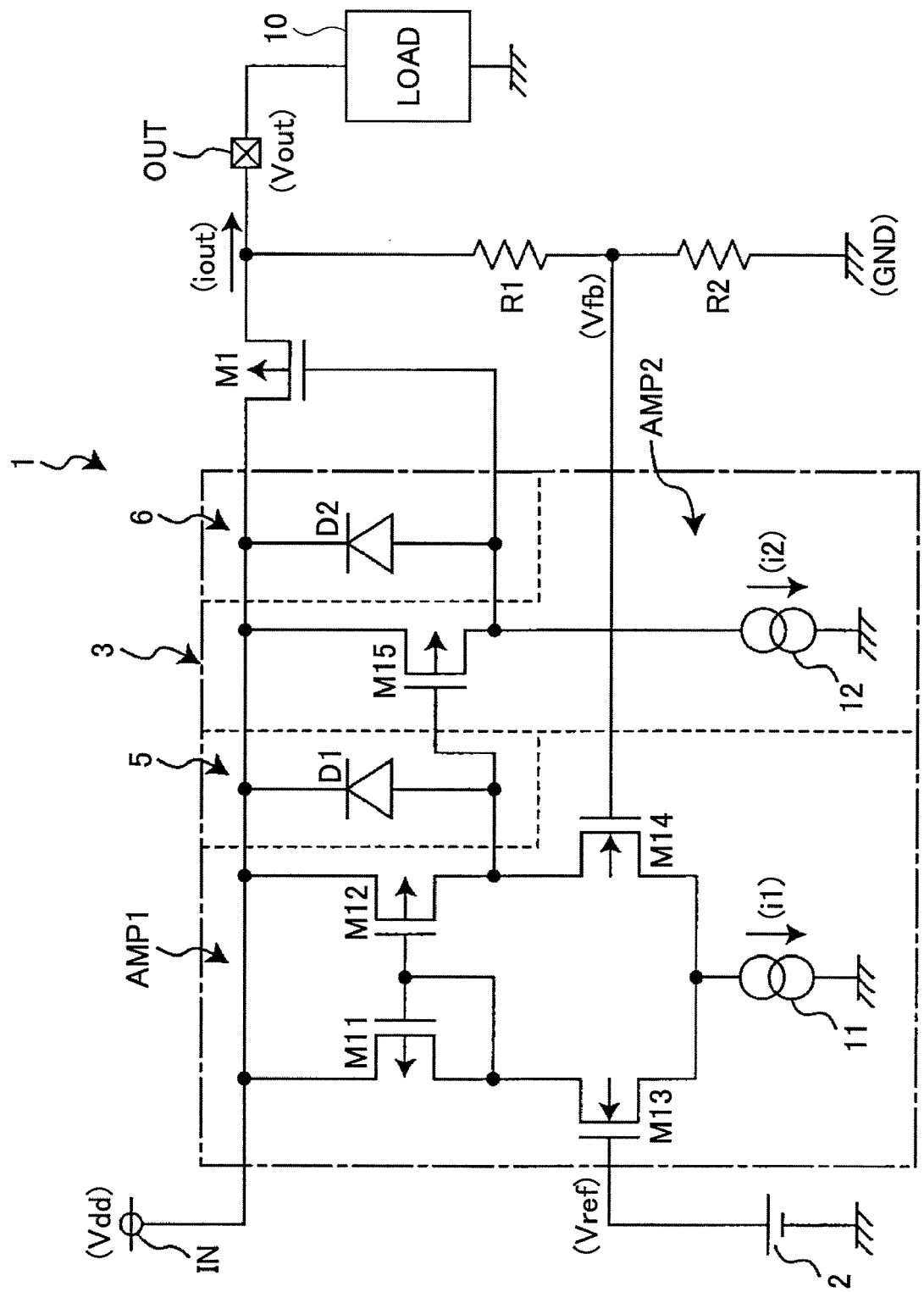
FIG. 2 shows an operational amplifier circuit according to an embodiment of the present invention.

FIG. 2 shows a constant voltage circuit 1 according to an embodiment of the invention.

The constant voltage circuit 1 is configured to receive an input voltage Vdd at an input terminal IN and generate a predetermined constant voltage that is outputted as an output voltage Vout at an output terminal OUT. Between the output terminal OUT and a ground voltage GND, a load 10 is connected. The load 10 may be an apparatus having a predetermined function to which power is supplied from the constant voltage circuit 1. Examples of such an apparatus include an automotive electronic device, a copy machine, a printer, or other image forming apparatuses. In a preferred embodiment, such an apparatus may include the constant voltage circuit 1.

The constant voltage circuit 1 includes a reference voltage generating circuit 2 configured to generate a predetermined reference voltage Vref; resistors R1 and R2 for output voltage detection configured to divide the output voltage Vout to obtain a divided voltage Vfb; a driver transistor M1 consisting of a PMOS transistor for controlling a current iout that flows to the output terminal OUT in accordance with a signal applied to its gate; and an operational amplifier circuit 3 that functions as an error amplifier circuit for controlling the operation of the driver transistor M1 such that the divided voltage Vfb becomes equal to the reference voltage Vref. The operational amplifier circuit 3, which is a control circuit unit, includes a differential amplifier circuit AMP1 which is a first amplifying stage, an amplifier circuit AMP2 which is a second amplifying stage, a first clamping circuit 5 consisting of a bipolar diode (to be hereafter referred to as a "diode") D1, and a second clamping circuit 6 consisting of another diode D2. The clamping circuits 5 and 6 are voltage limiting circuit units.

The differential amplifier circuit AMP1 includes PMOS transistors M11 and M12, NMOS transistors M13 and M14, and a constant current source 11 for supplying a predetermined constant current i1. The amplifier circuit AMP2 includes a PMOS transistor M15, and a constant current source 12 for supplying a predetermined constant current i2. The PMOS transistors M11, M12, and M15 are output transistors.

The driver transistor M1 is connected between the input terminal IN and the output terminal OUT. A series circuit of the resistors R1 and R2 is connected between the output terminal OUT and the ground voltage GND. The divided voltage Vfb is outputted at the connecting point between the resistors R1 and R2. To the gate of the NMOS transistor M13, which is an inverting input terminal of the operational amplifier circuit 3, the reference voltage Vref is input. To the gate of the NMOS transistor M14, which is a non-inverting input terminal of the operational amplifier circuit 3, the divided voltage Vfb is input. The NMOS transistors M13 and M14 constitute a differential pair. The PMOS transistors M11 and M12 form a current mirror circuit, providing a load to the differential pair.

The sources of the PMOS transistors M11 and M12 are connected to the input voltage Vdd. Their gates are mutually connected and their connecting point is connected to the drain of the PMOS transistor M11. The drain of the PMOS transistor M11 is connected to the drain of the NMOS transistor M13. The drain of the PMOS transistor M12 is connected to the drain of the NMOS transistor M14. The sources of the NMOS transistors M13 and M14 are mutually connected. Between their connecting point and the ground voltage GND, the constant current source 11 is connected. The connecting point between the PMOS transistor M12 and the NMOS transistor M14 is an output terminal of the amplifier circuit AMP1. To the output terminal is connected the anode of the diode D1, whose cathode is connected to the input voltage Vdd.

The source of the PMOS transistor M15 is connected to the input voltage Vdd. The gate of the PMOS transistor M15 is connected to the output terminal of the differential amplifier circuit AMP1. Between the drain of the PMOS transistor M15 and the ground voltage GND, the constant current source 12 is connected. The connecting point of the PMOS transistor M15 and the constant current source 12 is an output terminal of the amplifier circuit AMP2 as well as an output terminal of the operational amplifier circuit 3, connecting to the gate of the driver transistor M1. To the output terminal of the amplifier circuit AMP2 is connected the anode of the diode D2, whose cathode is connected to the input voltage Vdd.

In this configuration, the operational amplifier circuit 3 amplifies the voltage difference between the reference voltage Vref and the divided voltage Vfb and sends an output to the gate of the driver transistor M1, in order to control the output current iout from the driver transistor M1 such that the output voltage Vout has a predetermined voltage.

In the following, the operation of the diodes D1 and D2 is described.

The diode D1 is configured to limit the output voltage range of the differential amplifier circuit AMP1 with a reverse withstand voltage, thus applying a voltage clamp. Similarly, the diode D2 is configured to limit the output voltage range of the amplifier circuit AMP2 with a reverse withstand voltage, thus applying a voltage clamp.

During a steady-state operation, the output voltage of the differential amplifier circuit AMP1 and that of the amplifier circuit AMP2 are both close to the input voltage Vdd. The application of the voltage clamp on each of the output voltages by the diodes D1 and D2 does not lead to any problem. By thus clamping the output voltages of the differential amplifier circuit AMP1 and the amplifier circuit AMP2, it becomes possible to use low withstand-voltage transistors as the PMOS transistors M11, M12, and M15. Because the gate voltage of the driver transistor M1 is also clamped, a MOS transistor having a thin gate oxide film and a large current driving capacity can be used as the driver transistor M1.

When a MOS transistor whose output current characteristics have been improved by reducing the thickness of the gate oxide film is used as the driver transistor M1, the gate oxide film capacity is increased. Thus, in order to improve the transient property of input voltage and output current, the constant current i2 needs to be increased. In this case, the chip area can be reduced by employing a low-voltage fine MOS transistor with a large current driving capacity as the PMOS transistor M15. Further, the channel width W can be greatly reduced compared with a high withstand-voltage MOS transistor, so that the drain junction capacity can be reduced and improved transient response characteristics can be obtained. Because the channel length L can also be reduced, output resistance can be reduced and the pole of the output of the amplifier circuit AMP2 can be shifted to the high-frequency side. Similar effects can be obtained in the PMOS transistor M11 and M12 by using the above low-voltage fine MOS transistors, whereby the pole of the output of the differential amplifier circuit AMP1 can be shifted to the high-frequency side.

While in the embodiment shown in FIG. 2 the input voltage Vdd is a positive voltage and the constant voltage circuit 1 generates a positive output voltage Vout, the present invention is not limited to such an embodiment. In another embodiment, the constant voltage circuit may generate a negative constant voltage from a negative input voltage −Vdd, as shown in FIG. 3, in which elements identical or similar to those shown in FIG. 2 are indicated by similar numerals.

Figure 3:
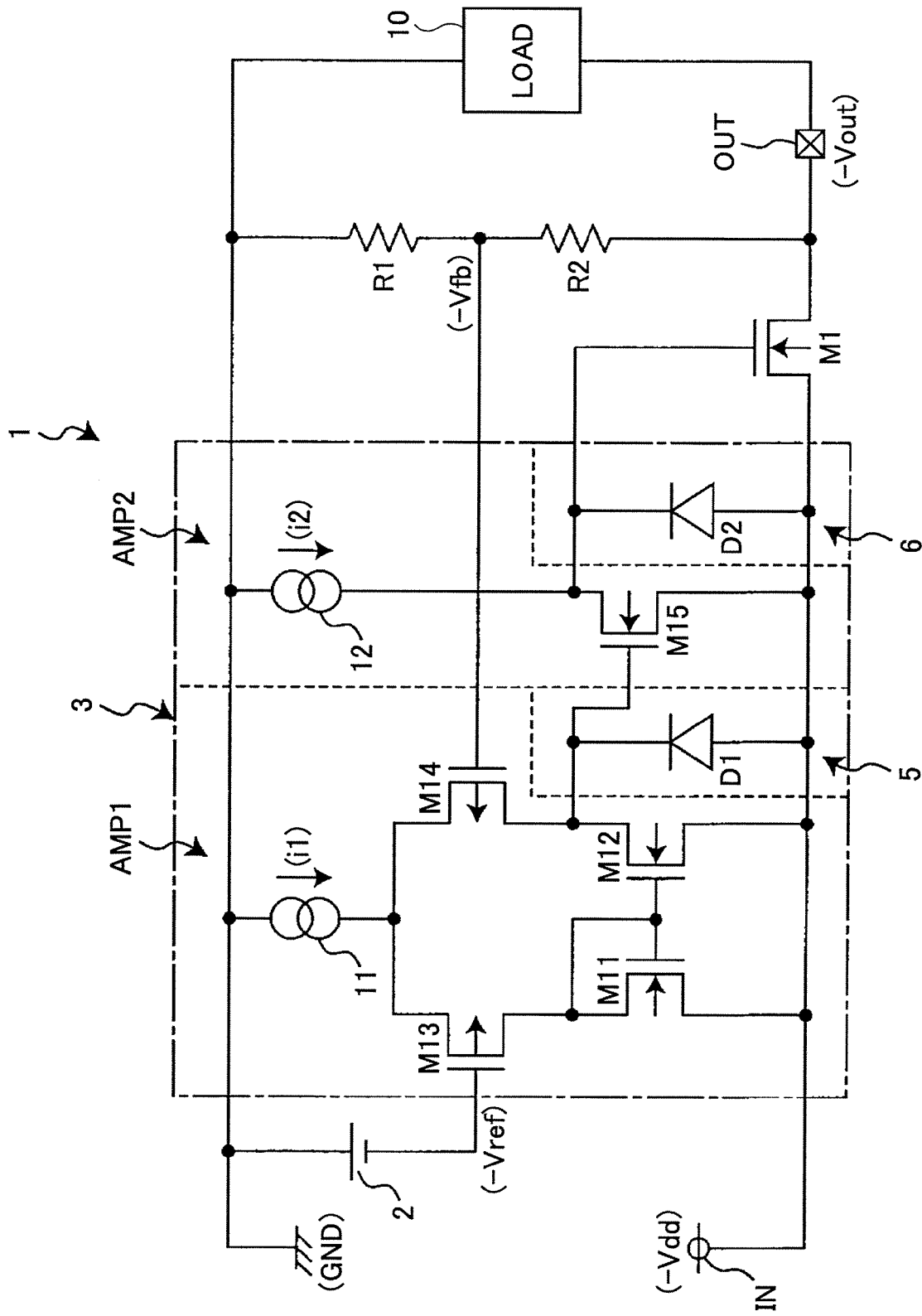
FIG. 3 shows another example of the operational amplifier circuit according to the embodiment of the present invention shown in FIG. 2.

The circuit of FIG. 3 differs from that of FIG. 2 in that the PMOS transistors of FIG. 2 are all replaced with NMOS transistors; the NMOS transistors of FIG. 2 are all replaced with PMOS transistors; the input voltage Vdd is replaced with a negative input voltage −Vdd; the reference voltage Vref and the divided voltage Vfb are both negative voltages; the cathode of the diode D1 is connected to the output terminal of the differential amplifier circuit AMP1 and the cathode of the diode D2 is connected to the output terminal of the amplifier circuit AMP2; and the anodes of the diodes D1 and D2 are both connected to the negative input voltage −Vdd. The operation of the constant voltage circuit 1 shown in FIG. 3 is similar to that of the constant voltage circuit 1 shown in FIG. 2 other than the fact that the individual voltages are negative voltages, the NMOS transistors are replaced with PMOS transistors, and that the PMOS transistors are replaced with NMOS transistors. Thus, the operation of the constant voltage circuit 1 of FIG. 3 is not described herein.

While in the foregoing description of the embodiments the clamping circuits employ diodes, the present invention is not limited to such embodiments. Namely, the clamping circuits may have any configuration as long as they can limit the voltage range at each output terminal of the differential amplifier circuit AMP1 and the amplifier circuit AMP2 of the operational amplifier circuit 3 to be equal to or smaller than a predetermined value.

Thus, in the operational amplifier circuit in the constant voltage circuit according to the foregoing embodiments of the invention, MOS transistors with small channel lengths L can be used as the PMOS transistors M11, M12, and M15, which are the output transistors in each amplifying stage, i.e., the differential amplifier circuit AMP1 and the amplifier circuit AMP2. As a result, output resistance can be reduced compared with the case where high withstand-voltage MOS transistors having a large channel length L are used as the PMOS transistors M11, M12, and M15. Accordingly, the pole of the operational amplifier circuit can be positioned on the high-frequency side so that, when used in a constant voltage circuit, an improved ripple removal ratio can be obtained in the high-frequency region of the output voltage of the constant voltage circuit.

In the foregoing description of the embodiments, the operational amplifier circuit 3 has been described as having a two-stage configuration including two amplifier circuits. However, the present invention is not limited to such an embodiment. In another embodiment, the operational amplifier circuit may have a multi-stage configuration in which the differential amplifier circuit unit consists of a series connection of plural amplifier circuits. Furthermore, while in the foregoing description of embodiments the operational amplifier circuit has been described with reference to a constant voltage circuit, this is merely an example and the present invention may be embodied in any circuit in which an operational amplifier circuit is employed.

The present application is based on the Japanese Priority Application No. 2007-199086 filed Jul. 31, 2007, the entire contents of which are hereby incorporated by reference.

What is claimed is:

1. An operational amplifier circuit having a multi-stage configuration including plural amplifying stages, the operational amplifier circuit comprising:
  a first amplifier circuit unit including a differential amplifier circuit configured to amplify a voltage difference between input voltages at two input terminals;
  a second amplifier circuit unit including at least one amplifier circuit connected in series with an output terminal of the first amplifier circuit unit in order to amplify an output voltage of the first amplifier circuit unit; and
  a voltage limiting circuit unit configured to limit the output voltage of the first amplifier circuit unit and an output voltage of each amplifier circuit of the second amplifier circuit unit so that the amplitude of each of the output voltages is equal to or smaller than a predetermined value.

2. The operational amplifier circuit according to claim 1, wherein the voltage limiting circuit unit includes a first clamping circuit and a second clamping circuit configured to limit the maximum value or the minimum value of the output voltage of the first amplifier circuit unit and the output voltage of each amplifier circuit of the second amplifier circuit unit, respectively.

3. The operational amplifier circuit according to claim 2, wherein each of the clamping circuits limits the maximum value or the minimum value of the corresponding output voltage by clamping based on a predetermined reverse withstand voltage of a bipolar diode.

4. The operational amplifier circuit according to claim 1, wherein each of the differential amplifier circuit of the first amplifier circuit unit and each amplifier circuit of the second amplifier circuit unit includes a fine MOS transistor as an output transistor.

5. The operational amplifier circuit according to claim 4, wherein the differential amplifier circuit includes a differential pair consisting of a pair of transistors, a load circuit providing a load to the differential pair, and a first constant current source configured to supply a predetermined first constant current to the differential pair;
  wherein the load circuit is formed by the output transistors.

6. The operational amplifier circuit according to claim 4, wherein an output signal from the differential amplifier circuit of the first amplifier circuit unit is inputted to the output transistor of each amplifier circuit of the second amplifier circuit unit, and
  wherein each amplifier circuit of the second amplifier circuit unit includes a second constant current source configured to supply a predetermined second constant current to the output transistor of the amplifier circuit.

7. A constant voltage circuit for converting an input voltage at an input terminal into a constant voltage that is outputted via an output terminal, the constant voltage circuit comprising:
  a driver transistor configured to cause a current to flow from the input terminal to the output terminal in accordance with a control signal; and
  a control circuit unit including an operational amplifier circuit with a multi-stage configuration including plural amplifying stages, wherein the amplifying stages are configured to amplify a differential voltage between a proportional voltage proportional to a voltage at the output terminal and a predetermined reference voltage to obtain the control signal that is applied to a control electrode of the driver transistor in order to control the operation of the driver transistor,
  wherein the operational amplifier circuit includes:
  a first amplifier circuit unit including a differential amplifier circuit configured to amplify a voltage difference between input voltages at two input terminals;
  a second amplifier circuit unit including at least one amplifier circuit connected in series with an output terminal of the first amplifier circuit unit to amplify an output voltage of the first amplifier circuit unit; and
  a voltage limiting circuit unit configured to limit the output voltage of the first amplifier circuit unit and an output voltage of each amplifier circuit of the second amplifier circuit unit such that the amplitude of each of the output voltages does not exceed a predetermined value.

8. The constant voltage circuit according to claim 7, wherein the voltage limiting circuit unit includes a first clamping circuit and a second clamping circuit each configured to limit the maximum value or the minimum value of the output voltage of the first amplifier circuit unit and the output voltage of each amplifier circuit of the second amplifier circuit unit, respectively.

9. The constant voltage circuit according to claim 8, wherein each of the clamping circuits is configured to limit the maximum value or the minimum value of the corresponding output voltage by clamping based on a predetermined reverse withstand voltage of a bipolar diode.

10. The constant voltage circuit according to claim 7, wherein each of the differential amplifier circuit of the first amplifier circuit unit and each amplifier circuit of the second amplifier circuit unit includes a fine MOS transistor as an output transistor.

11. The constant voltage circuit according to claim 10, wherein the differential amplifier circuit includes a differential pair consisting of a pair of transistors, a load circuit providing a load to the differential pair, and a first constant current source configured to supply a predetermined first constant current to the differential pair;
wherein the load circuit is formed by the output transistors.

12. The constant voltage circuit according to claim 10, wherein an output signal from the differential amplifier circuit of the first amplifier circuit unit is inputted to the output transistor of each amplifier circuit of the second amplifier circuit unit, and
wherein each amplifier circuit of the second amplifier circuit unit includes a second constant current source configured to supply a predetermined second constant current to the output transistor of the amplifier circuit.

13. An apparatus comprising the constant voltage circuit according to claim 7, wherein the apparatus performs a predetermined function using an output voltage of the constant voltage circuit as a power source.

14. The apparatus according to claim 13, wherein the apparatus is an automotive electronic apparatus.

15. The apparatus according to claim 13, wherein the apparatus is an image forming apparatus.

* * * * *